US008149862B1

(12) United States Patent
Forrest et al.

(10) Patent No.: US 8,149,862 B1
(45) Date of Patent: Apr. 3, 2012

(54) MULTI-PROTOCOL COMMUNICATION CIRCUIT

(75) Inventors: Craig S. Forrest, San Francisco, CA (US); Gaurav Singh, Santa Clara, CA (US); Kiran B. Kattel, Sunnyvale, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 1239 days.

(21) Appl. No.: 10/452,563

(22) Filed: May 30, 2003

Related U.S. Application Data

(60) Provisional application No. 60/426,691, filed on Nov. 15, 2002.

(51) Int. Cl.
*H04J 3/16* (2006.01)

(52) U.S. Cl. ........................................ 370/445; 370/465

(58) Field of Classification Search .................. 370/469, 370/465, 395.5, 445, 402, 403, 496
See application file for complete search history.

(56) References Cited

U.S. PATENT DOCUMENTS

| | | | | |
|---|---|---|---|---|
| 6,542,096 B2 * | 4/2003 | Chan et al. | ...................... | 341/100 |
| 6,650,141 B2 * | 11/2003 | Agrawal et al. | ................. | 326/41 |
| 6,653,957 B1 * | 11/2003 | Patterson et al. | ............ | 341/100 |
| 6,944,152 B1 * | 9/2005 | Heil | ............................. | 370/360 |
| 6,990,549 B2 * | 1/2006 | Main et al. | ..................... | 710/306 |
| 7,099,424 B1 * | 8/2006 | Chang et al. | ................... | 375/370 |
| 2002/0194415 A1 * | 12/2002 | Lindsay et al. | ............... | 710/305 |
| 2003/0039168 A1 * | 2/2003 | Chan et al. | ..................... | 365/233 |
| 2003/0061341 A1 * | 3/2003 | Loh et al. | ...................... | 709/224 |
| 2003/0179709 A1 * | 9/2003 | Huff | .............................. | 370/248 |
| 2004/0019707 A1 * | 1/2004 | Bissessur et al. | ................. | 710/3 |
| 2004/0019729 A1 * | 1/2004 | Kelley et al. | .................... | 710/306 |

OTHER PUBLICATIONS

IEEE Std 802.3ae-2002 (Amendment to IEEE Std 802.3-2002), Approved Jun. 13, 2002, pp. 2, 38-39, 45, 141-148, 247, and 273-278.*

* cited by examiner

*Primary Examiner* — Jianye Wu
(74) *Attorney, Agent, or Firm* — Vista IP Law Group, LLP

(57) ABSTRACT

A multi-protocol communication circuit, for example, a serializer-deserializer (SerDes) circuit for communicating between an internal logic circuit and an external link includes a select terminal configured to accept a select signal representing a plurality of mode select signal. A SerDes core is coupled to the select terminal and configured to transmit outbound data conforming with a first communication protocol in response to a first mode select signal and conforming with a second communication protocol in response to a second mode select signal. The SerDes core is also configured to receive inbound data respective to a first communication protocol in response to a first mode select signal and respective to a second communication protocol in response to a second mode select signal. Advantages of the invention include the ability to provide high bandwidth communications between integrated circuits that employ different SerDes protocols.

30 Claims, 5 Drawing Sheets

Basic SerDes Operation (Prior Art)

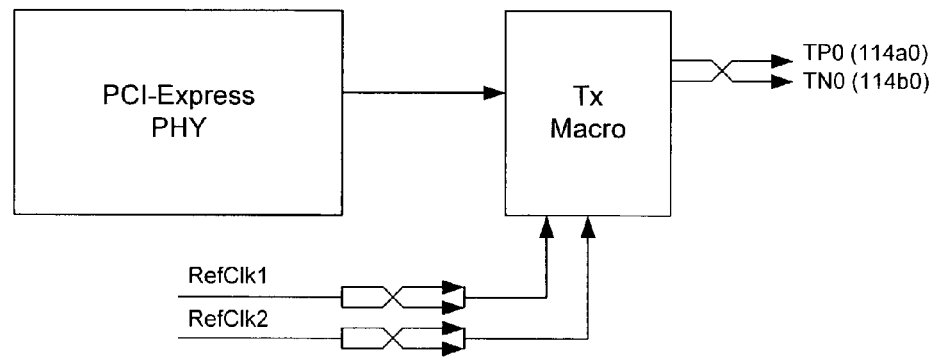
Figure 2A (PCI-Express Mode)
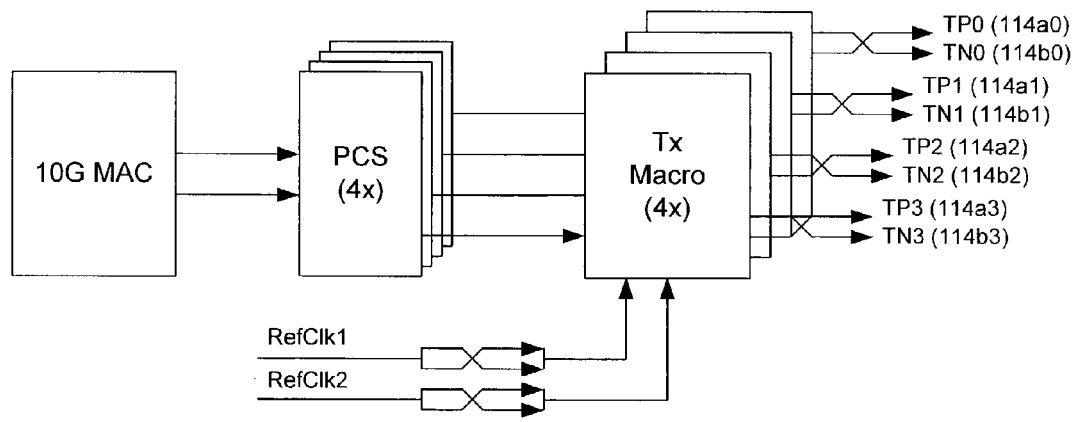
Figure 2B (XAUI Mode)

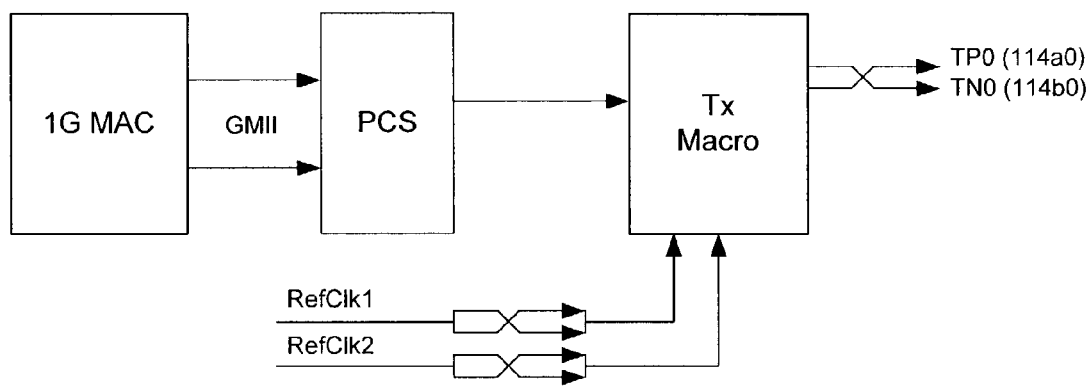
Figure 2C (GigE SerDes Mode)
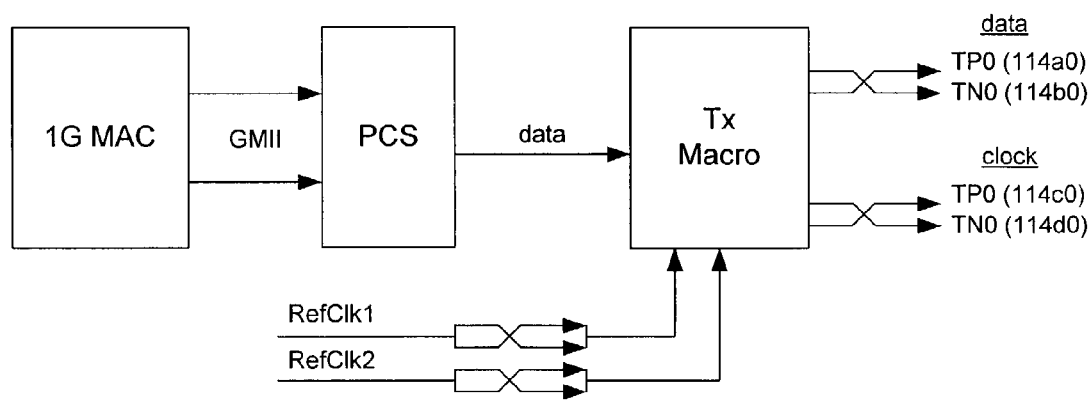
Figure 2D (GigE SGMII Mode)

MULTI-PROTOCOL COMMUNICATION CIRCUIT

REFERENCE TO RELATED APPLICATIONS

This application claims priority to U.S. Provisional Application No. 60/426,691 filed Nov. 15, 2002, incorporated herein by reference.

FIELD

The invention relates to the field of electronic circuitry, and more particularly to an intelligent multi-protocol communication circuit, which in one example is a serializer-deserializer referred to as a SerDes.

BACKGROUND

Advances in computer network communication and switching provide an improved experience for users who wish to store, retrieve and use information. The advent of a number of communication technologies has proven very useful to society, but the interoperability of these technologies has become an engineering challenge. There is a strong desire to support past, present and future device interoperability, and to improve the efficiency, use and deployment of circuits and systems in the electronics marketplace. The present invention provides useful novel techniques for achieving these goals.

One of the high-speed communications technologies that has been employed in electronic circuits is a serializer-deserializer, or SerDes, which supports the serial communication between circuits while using a parallel internal bus. FIG. 1 depicts a SerDes implementation according to the prior art. Chip A and Chip B both include internal circuitry that employs parallel communication and logical functions (e.g. arithmetic functions, memory functions, etc.). However, Chip A and Chip B communicate with one another over a serial communication link. The SerDes A and SerDes B convert the parallel communication from an internal n-bit bus to a serial data stream complete with data portions that signify the beginning of a communication sequence, the data itself, and the end of the communication sequence, etc. Likewise, the SerDes also serve to decode the serial data received on the recive side. A number of SerDes formats are used in the industry, but each often requires its own hardware design and therefore can only talk to another circuit that employs a similar SerDes interface.

What is needed is a circuit with the ability to communicate using a number of different communications protocols.

SUMMARY

The invention provides an intelligent multi-protocol communication circuit, for example, a serializer-deserializer (SerDes) that helps electronic circuits communicate with one another. The inventive SerDes is a circuit with the ability to communicate using a number of different SerDes protocols.

A multi-protocol SerDes circuit for communicating between an internal logic circuit and an external link includes a plurality of internal communication terminals configured to receive outbound information from the logic circuit and transmit inbound information to the logic circuit, and at least one external communication terminal configured to transmit outbound information to an external link and receive inbound information from the external link. The SerDes circuit includes a select terminal configured to accept a mode select signal representing a plurality of protocol modes. A SerDes core is coupled to the select terminal and configured to transmit outbound data conforming with one of a plurality of communication protocols in response to the mode select signal. The SerDes core is also configured to receive inbound data respective to one of a plurality of communication protocols in response to the mode select signal. While several protocols are described herein, any number of protocols can be implemented in the invention.

In one aspect of the invention, each of the communication protocols includes a number of communication parameters, and the SerDes core is configured to transmit outbound data conforming with the more-stringent combined communication parameters.

In another aspect of the invention, each of the communication protocols includes a number of communication tolerances, and the SerDes core is adapted to receive inbound data respective to the less-stringent combined communication tolerances.

In yet another aspect of the invention, each of the communication protocols includes a number of communication parameters and tolerances, and the SerDes core is adapted to communicate within communication parameters and tolerances conforming with the selected protocol.

In another aspect, the invention can include a number of additional SerDes groups that replicate the SerDes core functions. In this context, a group includes a channel, link or other communication conduit. In one implementation, each group is independently controlled with an independent mode select signal. In another implementation, multiple groups are controlled with a common mode select signal. In either event, the SerDes cores are configured to transmit outbound data conforming with one of a plurality of communication protocols in response to the mode select signal. Likewise, the SerDes cores are configured to receive inbound data respective to one of a plurality of communication protocols in response to the mode select signal. As stated above, while several protocols are described, any number of protocols can be implemented in the invention.

In aspects of the invention, the first communication protocol is a PCI-Express protocol, and the second communication protocol is a XAUI protocol. Other protocols can also be employed, for example, Gigabit Ethernet (GigE) Serdes mode, and GigE SGMII mode. In the case of the GigE SGMII mode, the communication is a parallel synchronous communication and not necessarily a Serdes functional protocol. Furthermore, several of the PCI-Express parameters and functions are exemplary of PCI-Express version 1, and compliance with future versions is anticipated.

Advantages of the invention include the ability to provide high bandwidth communications between integrated circuits that employ different SerDes protocols. This provides greater flexibility for engineers to design new circuits that are less dependent on the specific protocol of other circuits. In addition, the invention decreases the number of external pins required on a per instance basis since dedicated pins for dedicated protocols are no longer needed, and the final configuration can be chosen after the chip is designed. The invention may decrease the logic area needed inside the chip because the SerDes circuit is capable of performing functions that previously required multiple instances of dedicated circuitry. The invention enhances system design options and supports the system designer's choices to use the limited number of pins for more than one communication protocol. The invention promotes flexibility in product definition since the same chip may be used for many different configurations of SerDes protocol ports. These features provide circuit designers with greater options while simultaneously reducing costs.

BRIEF DESCRIPTION OF THE FIGURES

The invention is described with reference to the Figures, in which:

FIGS. 2A-D depict a variety of SerDes that can be used in the present invention;

DETAILED DESCRIPTION

The invention is described with reference to specific architectures and protocols. Those skilled in the art will recognize that the description is for illustration and to provide the best mode of practicing the invention. The description is not meant to be limiting. For example, reference is made to Ethernet protocol, PCI-Express protocol, XAUI protocol, Gigabit Ethernet (GigE) Serdes protocol, and GigE SGMII protocol but the invention may be applicable to other protocols as well. Moreover, reference is made to chips that contain integrated circuits while other hybrid or meta-circuits combining those described in chip form is anticipated. While several protocols are described by example, any number of protocols can be implemented in the invention.

FIGS. 2A-D depict a variety of SerDes that can be used in the present invention. Example modes described herein are PCI-Express mode, XAUI mode, GigE Serdes mode, and GigE SGMII mode. In the case of the GigE SGMII mode, the clock is not embedded in the data, but the data communication is serial between devices. These modes represent different protocols that can be used with the invention, but are not an exhaustive list. These protocols are known in the art and specifications for the protocols are publicly available from standards bodies such as the IEEE. To communicate using these and other protocols, the invention incorporates a circuit that is responsive to a mode select signal, described below.

Figure 1:
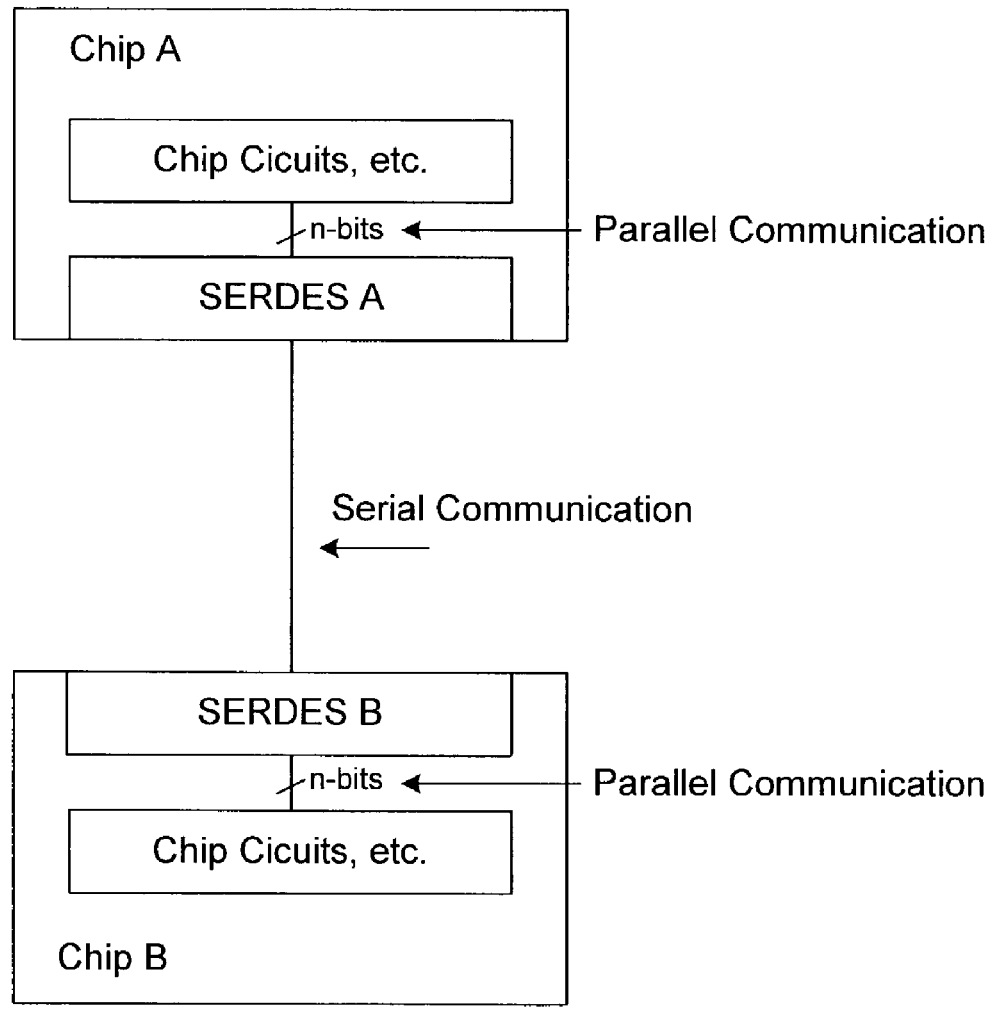
FIG. 1 depicts a SerDes communication system according to the prior art.
Figure 3:
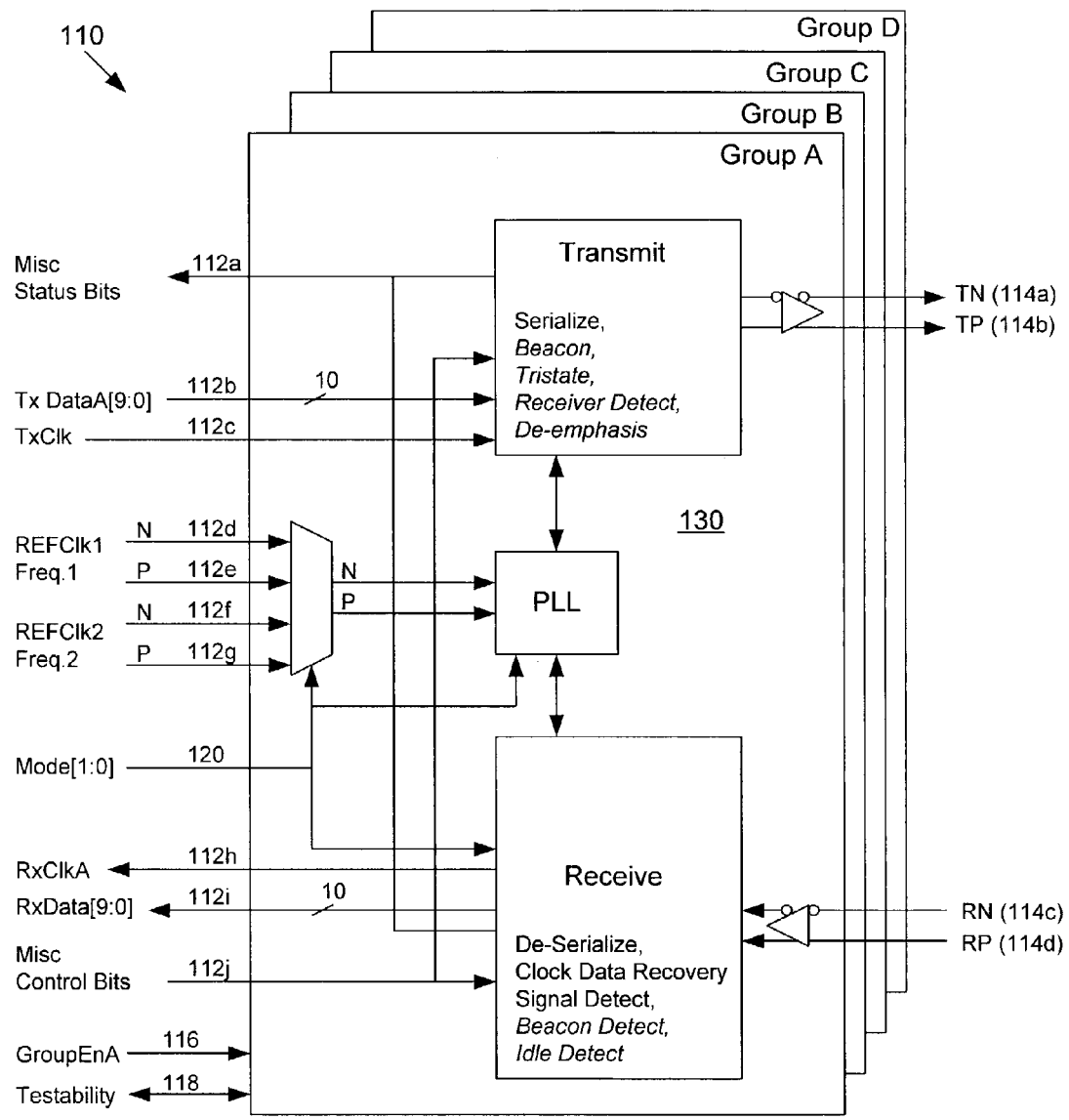
FIG. 3 depicts a multi-protocol SerDes according to an embodiment of the invention.

FIG. 3 depicts a multi-protocol SerDes circuit 110 according to an embodiment of the invention. The SerDes circuit 110 includes a plurality of internal communication terminals 112a-112j configured to receive outbound information from the logic circuit and transmit inbound information to the logic circuit. The SerDes circuit 110 also includes external communication terminals 114a-114b configured to transmit outbound information to an external link and communication terminals 114c-114d configured to receive inbound information from the external link. As shown in FIG. 3, the circuitry described can be replicated into an arbitrary number of Groups A-D. In such case, the mode control can be independent or shared as described below.

The SerDes circuit 110 includes a mode select terminal 120 configured to accept a mode select signal representing a plurality of modes. These modes control the data type and SerDes protocol communication with the external communication terminals 114a-114d.

The SerDes circuit 110 includes a SerDes transmit core 130 coupled to the select terminal 120 and configured to transmit outbound data conforming with one of a plurality of communication protocols in response to the mode select signal. The SerDes core 130 is also configured to receive inbound data respective to one of a plurality of communication protocols in response to the mode select signal.

For example, in one aspect of the invention, the two SerDes protocols are PCI-Express and XAUI. Certain of the functions, parameters and tolerances shown in Tables 1 and 2 are specific to PCI-Express and others are specific to XAUI. Furthermore, several of the PCI-Express parameters and functions are exemplary of PCI-Express version 1, and compliance with future versions is anticipated. The selection of these functions is controlled by the mode select signal 120. Tables 1 and 2 show the relationship between the PCI-Express and XAUI protocols. For example, the reference clock RefCLK for the PCI-Express protocol is 250 MHz while the RefCLK for the XAUI protocol is 312.5 MHz. Control and status bits shown in Table 1 designated as (a)-(g) are specific to the PCI-Express protocol. When the mode select signal is 0, these bits are incorporated when transmitting and expected when receiving, for example. Other bits may exist for these and other protocols.

TABLE 1

| SIGNAL | PCI-EXPRESS | XAUI |
|---|---|---|
| Mode Select Signal | 0 | 1 |
| RefCLK | 250 MHz | 312.5 MHz |
| Misc. Control | Control Signal<br>(a) Enable Electrical Idle<br>(b) Enable Beacon Detect<br>(c) Low Power Mode<br>(d) Tristate Enable | Control Signal |
| Misc. Status | Status Signal<br>(e) Electrical Idle Detect<br>(f) Beacon Detected<br>(g) Receiver Detected | Status Signal |
| TxData[9:0] | Transmit Data | Transmit Data |
| RxData[9:0] | Receive Data | Receive Data |

The physical differences are identified in Table 2 below.

TABLE 2

| FEATURE | PCI-EXPRESS | XAUI |
|---|---|---|
| Clock Dependencies | +/− 300 ppm | +/− 100 ppm |
| Spread Spectrum Clock | 0 to −0.5% Modulation | NA |
| Coupling | AC couple, Cap 75-500 nF | AC coupled |
| Receiver Detection | Transmitter has to be able to detect is a receiver exists | NA |
| Surprise Removal Detection | Detect if one end of the link has been disabled or disconnected | LOS |
| Electrical Idle | Tx has to go to an electrical idle state where the differential output voltage is less than 20 mV | NA |
| Link Loss (medium) | 13.2 dB | 12 dB |
| Tx Jitter | 0.3 UI | 0.35 UI |
| Rx Jitter Tolerance | 0.6 UI | 0.65 UI |
| Tx Differential Amplitude | 800 mV − 1.2 V | 800 mV − 1.6 V |
| De-emphasis | Specified at −3.5 dB | Not specified, can be optimized according to transmission medium |
| Beacon | Tx has to transmit a valid beacon signal, and received has to be able to detect it while the Rx is L2 Power saving mode | NA |
| Electrical Idle | Tx has to be able to go to an electrical idle state where the | NA |

TABLE 2-continued

| FEATURE | PCI-EXPRESS | XAUI |
|---|---|---|
| | differential output voltage is less than 20 mV | |
| Initial DC Rx High Impedance | Min 200K Ohms | NA |

As shown in Tables 1 and 2, a number of differences are apparent between the PCI-Express and XAUI SerDes protocols including logical differences and physical differences. In one aspect of the invention, the SerDes is configured to transmit outbound data conforming with the more-stringent combined communication parameters. The communication protocols includes a number of communication parameters, for example, a first communication protocol may employ a jitter limit of 0.3UI (PCI-Express), while a second communication protocol may employ a jitter limit of 0.35UI (XAUI). In this aspect of the invention, the SerDes core is configured to transmit outbound data conforming with the more-stringent combined communication parameters, for example 0.3UI.

In another aspect of the invention, the communication protocols includes a number of communication tolerances, for example, a first communication protocol may employ a clock dependency of +/−300 ppm (PCI-Express), while a second communication protocol may employ a clock dependency of +/−100 ppm (XAUI). In this aspect of the invention, the SerDes is adapted to receive inbound data respective to the less-stringent combined communication tolerances, for example +/−300 ppm.

In yet another aspect of the invention, each of the communication protocols includes a number of communication parameters and tolerances, and the SerDes core is adapted to communicate within communication parameters and tolerances conforming with the selected protocol. For example, a first communication protocol includes a number of communication parameters and tolerances and a second communication protocol includes a number of communication parameters and tolerances. In this aspect, the SerDes core is adapted to communicate within communication parameters and tolerances conforming with the selected protocol.

Figure 4A:
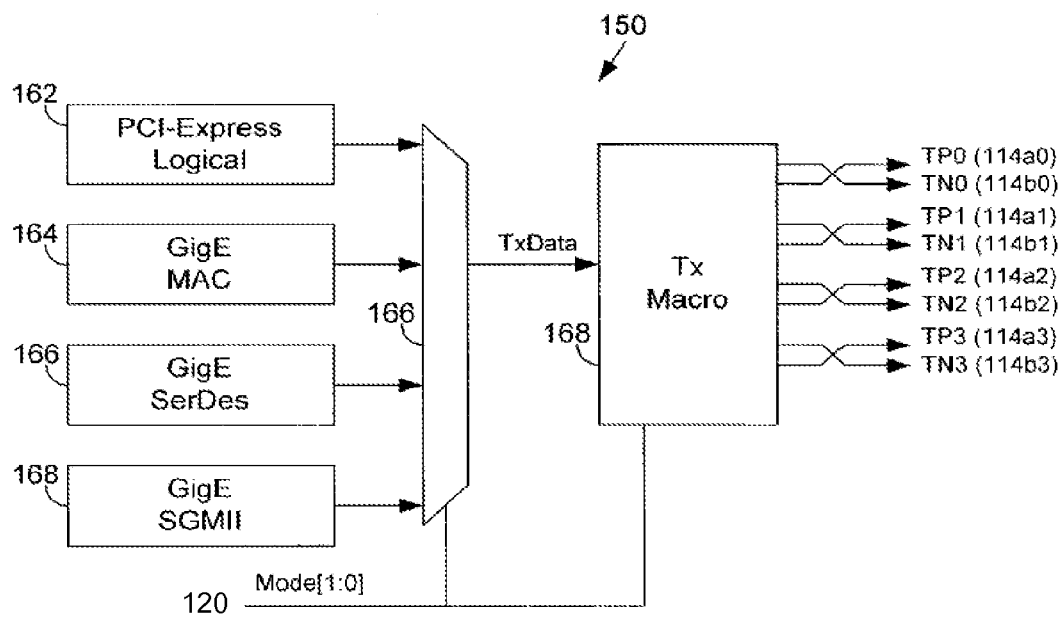
FIG. 4A depicts the logical transmission side of the SerDes of FIG. 3.

FIG. 4A depicts the logical transmission side 150 of the SerDes of FIG. 3. FIG. 4A depicts a PCI-Express logical circuit 162, a GigE media access control (MAC) circuit 164, a GigE Serdes circuit 166 and a GigE SGMII circuit 168. These circuits transmit information through a multiplexer 166 that is also connected to the mode select terminal 120. The multiplexer 166 directs the correct data to the transmit macro 168, which modifies the data to conform with the selected protocol and transmits the data to the external terminals 114a-114b.

Figure 4B:
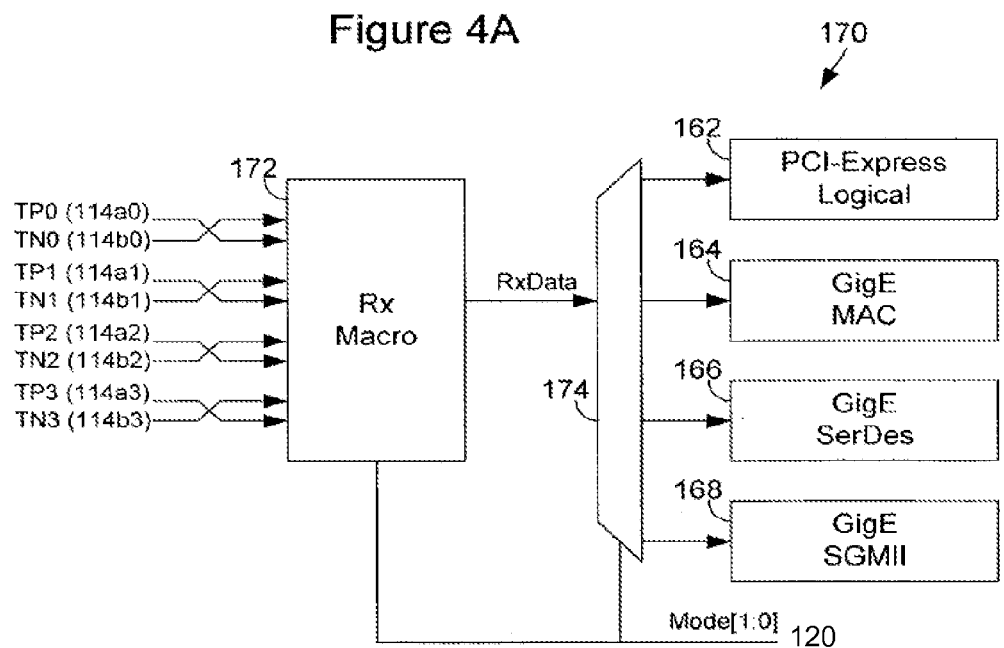
FIG. 4B depicts the logical receive side of the SerDes of FIG. 3.

FIG. 4B depicts the logical receive side 170 of the SerDes of FIG. 3. FIG. 4B depicts a receive macro 172 coupled to external terminals 114c-114d. The receive macro is coupled to the mode select terminal 120 and receives data corresponding to the selected mode. The receive macro decodes the inbound data respective to the selected protocol and passes the data to a demultiplexer 174 that is also coupled to the mode select terminal 120. The demultiplexer directs the inbound data to the selected path and ultimately to the selected logical circuit, e.g. PCI-Express logical circuit 162, GigE MAC circuit 164, GigE Serdes circuit 166 or GigE SGMII circuit 168.

As shown in FIG. 3, the invention can include a number of additional groups A-D that replicate the functions described with reference to group A. It is anticipated that the invention can employ any arbitrary number of groups. In this context, a group includes a channel, link or other communication conduit. In one implementation, each group is independently controlled with an independent mode select signal. In another implementation, multiple groups are controlled with a common mode select signal. In either event, the SerDes cores are configured to transmit outbound data conforming with one of a plurality of communication protocols in response to the mode select signal. Likewise, the SerDes cores are configured to receive inbound data respective to one of a plurality of communication protocols in response to the mode select signal. As stated above, while several protocols are described, any number of protocols can be implemented in the invention.

Advantages of the invention include the ability to provide high bandwidth communications between integrated circuits that employ different SerDes protocols. This provides greater flexibility for engineers to design new circuits that are less dependent on the specific protocol of other circuits. In addition, the invention decreases the number of external pins required on a per instance basis since dedicated pins for dedicated protocols are no longer needed, and the final configuration can be chosen after the chip is designed. The invention may decrease the logic area needed inside the chip because the SerDes circuit is capable of performing functions that previously required multiple instances of dedicated circuitry. The invention enhances system design options and supports the system designer's choices to use the limited number of pins for more than one communication protocol. The invention promotes flexibility in product definition since the same chip may be used for many different configurations of SerDes protocol ports. These features provide circuit designers with greater options while simultaneously reducing costs.

Having disclosed exemplary embodiments and the best mode, modifications and variations may be made to the disclosed embodiments while remaining within the subject and spirit of the invention as defined by the following claims.

The invention claimed is:

1. A multi-protocol serializer/deserializer (SerDes) circuit for communicating between an internal logic circuit and an external link, comprising:
   a plurality of internal communication terminals configured to receive outbound information from the logic circuit and transmit inbound information to the logic circuit;
   an external communication terminal configured to transmit outbound information to the external link and receive inbound information from the external link;
   a select terminal configured to accept a mode select signal representing a plurality of different communication protocols, said communication protocols differing in communication signaling and format and not only in communication speed; and
   a single SerDes core configured to handle each of said plurality of different protocols, said SerDes core coupled to the select terminal and configured to transmit outbound data conforming with one of said plurality of communication protocols in response to the mode select signal, and to receive inbound data respective to one of said plurality of communication protocols in response to the mode select signal.

2. The multi-protocol SerDes of claim 1, wherein:
   said external communication terminal is a plurality of external communication terminals.

3. The multi-protocol SerDes of claim 1, wherein
   each of the communication protocols include a number of communication parameters; and the SerDes core is configured to transmit outbound data conforming with a combination of more stringent communication parameters of the communication protocols.

4. The multi-protocol SerDes of claim 1, wherein
the SerDes core is adapted to receive inbound data respective to a combination of less stringent communication tolerances of the communication protocols.

5. The multi-protocol SerDes of claim 3, wherein
the SerDes core is adapted to receive inbound data respective to a combination of less stringent communication tolerances of the communication protocols.

6. The multi-protocol SerDes of claim 3, wherein
each of the communication protocols includes a number of communication parameters; and
the SerDes core is adapted to communicate within communication parameters and tolerances conforming with the selected protocol.

7. The multi-protocol SerDes of claim 1, further comprising:
a second select terminal configured to accept a mode select signal representing a second plurality of protocols; and
a second SerDes core coupled to the second select terminal and configured to transmit outbound data conforming with one of said second plurality of communication protocols in response to the mode select signal, and to receive inbound data respective to one of said second plurality of communication protocols in response to the mode select signal.

8. The multi-protocol SerDes of claim 1, wherein
the communication protocols include the set of PCI-Express protocol and XAUI protocol.

9. The multi-protocol SerDes of claim 1, wherein
the communication protocols include the set of PCI-Express protocol, XAUI protocol, GigE protocol, and GigE SGMII protocol.

10. The multi-protocol SerDes of claim 6, wherein
the communication protocols include the set of PCI-Express protocol and XAUI protocol.

11. The multi-protocol SerDes of claim 6, wherein
the communication protocols include the set of PCI-Express protocol, XAUI protocol, GigE protocol, and GigE SGMII protocol.

12. A method of communicating between an internal logic circuit and an external link, comprising the steps of:
accepting a mode select signal representing a plurality of different communication protocols at a SerDes circuit comprising a single SerDes core configured to handle each of said plurality of different communication protocols and an external communication terminal configured to transmit outbound information to the external link and receive inbound information from the external link, said communication protocols differing in communication signaling and format and not only in communication speed; and at least one of:
(a) transmitting outbound data conforming with one of said plurality of communication protocols in response to the mode select signal; and
(b) receiving inbound data respective to one of said plurality of communication protocols in response to the mode select signal.

13. The method of claim 12, wherein the method comprises steps (a) and (b).

14. The method of claim 12, wherein: each of the communication protocols includes a number of communication parameters; and
the transmitting step transmits outbound data conforming with a combination of more stringent communication parameters of the communication protocols.

15. The method of claim 12, wherein:
the receiving step receives inbound data respective to a combination of less-stringent communication tolerances of the communication protocols.

16. The method of claim 14, wherein
the receiving step receives inbound data respective to a combination of less-stringent communication tolerances of the communication protocols.

17. The method of claim 13, wherein:
each of the communication protocols includes a number of communication parameters;
the transmitting step transmits outbound data conforming with a combination of more-stringent communication parameters of the communication protocols;
the receiving step receives inbound data respective to a combination of less-stringent communication tolerances of the communication protocols.

18. The method of claim 12, wherein
each of the communication protocols includes a number of communication parameters;
the transmitting step transmits outbound data conforming with communication parameters conforming with the selected protocol; and
the receiving step receives inbound data conforming with communication tolerances conforming with the selected protocol.

19. The method of claim 12, wherein
the communication protocols include the set of PCI-Express protocol and XAUI protocol.

20. The method of claim 12, wherein
the communication protocols include the set of PCI-Express protocol, XAUI protocol, GigE protocol, and GigE SGMII protocol.

21. The method of claim 18, wherein: the communication protocols include the set of PCI-Express protocol and XAUI protocol.

22. The method of claim 18, wherein
the communication protocols include the set of PCI-Express protocol, XAUI protocol, GigE protocol, and GigE SGMII protocol.

23. A multi-protocol communication circuit for communicating between an internal logic circuit and an external link comprising:
a plurality of internal communication terminals configured to receive outbound information from the logic circuit and transmit inbound information to the logic circuit;
an external communication terminal configured to transmit outbound information to the external link and receive inbound information from the external link;
a select terminal configured to accept a mode select signal representing a plurality of different communication protocols, said communication protocols differing in communication signaling and format and not only in communication speed; and
a single SerDes core configured to handle each of said plurality of different protocols, said SerDes core coupled to the select terminal and configured to transmit outbound data conforming with one of said plurality of communication protocols in response to the mode select signal, and to receive inbound data respective to one of said plurality of communication protocols in response to the mode select signal.

24. The multi-protocol communication circuit of claim 23, wherein:

said external communication terminal is a plurality of external communication terminals.

25. The multi-protocol communication circuit of claim 23, wherein: each of the communication protocols include a number of communication parameters; and the communication core is configured to transmit outbound data conforming with a combination of more-stringent communication parameters of the communication protocols.

26. The multi-protocol communication circuit of claim 23, wherein:

the communication core is adapted to receive inbound data respective to a combination of less-stringent communication tolerances of the communication protocols.

27. The multi-protocol communication circuit of claim 25, wherein:

the communication core is adapted to receive inbound data respective to a combination of less-stringent communication tolerances of the communication protocols.

28. The multi-protocol communication circuit of claim 23, wherein:

each of the communication protocols includes a number of communication parameters; and the communication core is adapted to communicate within communication parameters and tolerances conforming with the selected protocol.

29. The multi-protocol communication circuit of claim 28, further comprising:

a second select terminal configured to accept a second mode select signal representing a second plurality of protocols; and a second communication core coupled to the second select terminal and configured to transmit outbound data conforming with one of said second plurality of communication protocols in response to the mode select signal, and to receive inbound data respective to one of said second plurality of communication protocols in response to the mode select signal.

30. The multi-protocol SerDes of claim 1, wherein the plurality of protocols control a data type and a protocol communication with the external communication terminal.

* * * * *